United States Patent [19]

Re et al.

[11] Patent Number: 5,075,246

[45] Date of Patent: Dec. 24, 1991

[54] METHOD OF MANUFACTURING INTEGRATED CIRCUITS HAVING ELECTRONIC COMPONENTS OF TWO DIFFERENT TYPES EACH HAVING PAIRS OF ELECTRODES OBTAINED FROM THE SAME POLYCRYSTALLINE SILICON LAYERS AND SEPARATED BY DIFFERENT DIELECTRIC MATERIALS

[75] Inventors: Danilo Re, Bernareggio; Alfonso Maurelli, Sulbiate, both of Italy

[73] Assignee: SGS-Thomson Microelectronics Srl., Agrate Brianza, Italy

[21] Appl. No.: 625,764

[22] Filed: Dec. 13, 1990

[30] Foreign Application Priority Data

Dec. 14, 1989 [IT] Italy .................................. 22683 A/89

[51] Int. Cl.$^5$ ........................................... H01L 21/336
[52] U.S. Cl. ........................................ 437/47; 437/43; 437/60; 437/195; 148/DIG. 14
[58] Field of Search .................... 437/47, 52, 43, 60, 437/919, 54, 195; 357/51; 148/DIG. 14

[56] References Cited

U.S. PATENT DOCUMENTS

| | | | |
|---|---|---|---|
| 4,441,249 | 4/1984 | Alspector et al. | 437/60 |
| 4,536,947 | 8/1985 | Bohr et al. | 437/60 |
| 4,639,274 | 1/1987 | Krishna | 437/60 |
| 4,905,064 | 2/1990 | Yabu et al. | 357/51 |
| 4,971,924 | 11/1990 | Tigelaar et al. | 437/47 |

Primary Examiner—Brian E. Hearn
Assistant Examiner—C. Chaudhari
Attorney, Agent, or Firm—Wenderoth, Lind & Ponack

[57] ABSTRACT

A method of manufacturing integrated circuits includes steps: forming a first layer of polycrystalline silicon on areas of a semiconductor substrate previously covered with a dielectric material; forming a first insulating layer and a second thin layer of polycrystalline silicon acting as a shield; removing the second layer of polycrystalline silicon and the first insulating layer except from predetermined areas for containing a first type of electronic component; doping the exposed portion of the first layer of polycrystalline silicon; forming, by deposition, masking and removal, of a second insulating layer on the first layer of polycrystalline silicon in an area for containing a second type of electronic component; forming of a third layer of polycrystalline silicon; masking predetermined zones of this latter layer lying at least partially above the areas intended for the two types of electronic components, and removing the polycrystalline silicon external to these predetermined zones. The method continues with conventional steps and makes it possible to obtain, for instance, EPROM memory cells and capacitors using the same polycrystalline silicon depositing steps for forming their electrodes, without dispensing with the maximum freedom and precision in the choice of the physical characteristics and dimensions of the two types of components.

12 Claims, 3 Drawing Sheets

METHOD OF MANUFACTURING INTEGRATED CIRCUITS HAVING ELECTRONIC COMPONENTS OF TWO DIFFERENT TYPES EACH HAVING PAIRS OF ELECTRODES OBTAINED FROM THE SAME POLYCRYSTALLINE SILICON LAYERS AND SEPARATED BY DIFFERENT DIELECTRIC MATERIALS

BACKGROUND OF THE INVENTION

1. Field of the Invention

The present invention relates to a method of manufacturing monolithic integrated circuits and more particularly to a method for forming electronic components of two different types each having pairs of electrodes separated by different dielectric materials on a substrate of a semiconductor material.

2. Description of the Prior Art

Integrated circuits, called microprocessors or microcontrollers, are known which form complex circuit systems generally comprising a memory unit, a processing unit and input and output interface circuits.

The memory units comprise matrices of random access memory (RAM) cells, matrices of non-volatile fixed program memory (ROM) cells and matrices of non-volatile electrically programmable memory (EPROM and/or EEPROM) cells having two levels of polycrystalline silicon. The processing unit and, in particular, the interface circuits require a large number of capacitors for their operation.

The EPROM and EEPROM memory cells and the capacitors have a structure which is similar in certain respects, since they both have two electrodes separated by a dielectric, as a result of which some of the stages of manufacture of these two types of components may in principle be common.

However, the functional characteristics of the memory cells and capacitors are, as is known, very different and if the same manufacturing stages are to be used for both it is necessary to use compromise solutions which do not make it possible to obtain the structures which are most advantageous for the correct operation and maximum integration density for either the memory cells or the capacitors.

A conventional technique for the manufacture of integrated circuits of this type comprises the deposition of a first layer of polycrystalline silicon to form the "floating" gate electrode of the memory cells and a first electrode of the capacitors, the formation of a layer of silicon dioxide by growth at a high temperature so as to form the so-called "interpoly" dielectric of the memory cells and the dielectric of the capacitors and then the deposition of a second layer of polycrystalline silicon to form the control electrode of the cells and the second electrode of the capacitors.

Although this technique is very advantageous from the economic point of view, since the memory cells and capacitors are obtained by the same method steps, it is not convenient in many cases since if the method is developed to provide high quality cells, it is impossible to choose the most appropriate specific capacitance or the best dielectric for the capacitors since the thickness and physical characteristics of the dielectric are determined by the desired cell structure. Furthermore, as it is necessary to keep the level of doping of the first polycrystalline silicon layer low (resistivity greater than 200 ohm/square cm) to obtain a high quality "interpoly" dielectric for the correct operation of the memory cells, it is not possible to obtain capacitors having a sufficiently low voltage coefficient (the voltage coefficient is the percentage variation of the capacitance as a function of the voltage applied to the electrodes of the capacitor). The values which can be obtained with this method are not less than 300 ppm/Volt, while the values required for a high quality capacitor are less than 20 ppm/Volt.

One way of partially remedying the drawbacks of the prior art would be to increase the doping of the polycrystalline silicon solely in the capacitor zones, by suitable masking and implantation operations thereon. In this way the capacitors would have fairly low voltage coefficients, but would nevertheless be subject to the constraints imposed by the thickness and physical characteristics of the dielectric desired for the memory cells. Moreover, as a result of the formation of the silicon dioxide by growth, the dimensioning of the capacitors would be rather critical since it would be conditioned by a method parameter which is difficult to control, i.e. the doping of the first polycrystalline silicon layer. As is known, the rate of growth of the oxide depends on the doping of the underlying silicon.

According to a further known method, a third level of polycrystalline silicon is used for the integration of capacitors and memory cells having two levels of polycrystalline silicon without the drawbacks of the prior art.

It is possible in this way to construct the electrodes of the cells and capacitors separately, but with the addition of manufacturing stages which are often critical from the point of view of the quality of the finished components. In particular, there are problems with the complete removal of the portions of the third polycrystalline silicon layer from the zones of the memory cells where there are substantial reliefs and depressions, and there is a detrimental effect on the planar nature of the final surface of the integrated circuit, particularly in those zones in which the three layers of polycrystalline silicon are superimposed in contact with one another, which, as is known, compromises the good quality and reliability of the metal connections between the components of the integrated circuit.

SUMMARY OF THE INVENTION

An object of the present invention is to obtain, using a relatively simple method, integrated circuits of the type described above, in which the electronic components of different types have electrical characteristics which can be independently optimized.

A more particular object of the present invention is to provide a method for the production of integrated circuits comprising EPROM and/or EEPROM memory cells with two levels of polycrystalline silicon and capacitors which does not differ much from the conventional method for the manufacture of the memory cells and which allows the maximum freedom of choice of the physical characteristics and dimensions of the structure of both the cells and the capacitors.

These objects are achieved by providing a method of manufacturing integrated circuits on a substrate of a semiconductor material, the integrated circuits comprising electronic components of two different types each having pairs of electrodes separated by dielectric materials, the method comprising the steps of:

selectively forming dielectric materials of at least two different types on the substrate;

forming and doping a first polycrystalline silicon layer;

defining, by masking and removal, of predetermined zones of the first polycrystalline silicon layer on areas of the substrate previously covered with the dielectric materials;

forming a first insulating layer comprising at least one dielectric material, on the first polycrystalline silicon layer;

forming a second polycrystalline silicon layer on the first insulating layer;

masking at least one predetermined area of the second polycrystalline silicon layer, and removing the portion of the second polycrystalline silicon layer external to this predetermined area and removing the underlying portion of the first insulating layer;

forming a second insulating layer comprising at least one dielectric material, on the first polycrystalline silicon layer;

masking at least one other predetermined area of the second insulating layer and removing the portion of the second insulating layer external to this other predetermined area;

forming a third polycrystalline silicon layer at least on the respective predetermined areas of the second polycrystalline silicon layer and the second insulating layer;

masking predetermined zones of the third polycrystalline silicon layer lying at least partially above the predetermined areas and removing the portion of the third polycrystalline silicon layer external to these predetermined zones.

These objects may also be achieved by providing a method of manufacturing integrated circuits on a silicon substrate, the integrated circuits comprising capacitors and at least one of EPROM and EEPROM memory cells the method comprising the steps of:

forming, by growth at a high temperature on the silicon substrate, relatively thick portions of silicon dioxide which define active zones for containing the memory cells;

forming, by growth, on the active zones, of a relatively thin layer of silicon dioxide;

forming and doping a first polycrystalline silicon layer on the relatively thick portions and on the relatively thin layer of silicon dioxide;

defining, by masking and removal, of predetermined zones of the first polycrystalline silicon layer;

forming a first insulating layer, comprising at least one dielectric material, on the first polycrystalline silicon layer;

forming a second polycrystalline silicon layer on the first insulating layer;

masking at least one predetermined area of the second polycrystalline silicon layer lying above an active zone, and removing the portion of the second polycrystalline silicon layer external to this predetermined area and removing the underlying portion of the first insulating layer; (doping the exposed portion of the first polycrystalline silicon layer;

forming a second insulating layer, comprising at least one dielectric material, on the first polycrystalline silicon layer;

masking at least one other predetermined area of the second insulating layer lying above at least one of the relatively thick portions of silicon dioxide and removing the portion of the second insulating layer external to this other predetermined area to define the dielectric of a capacitor;

forming a third polycrystalline silicon layer at least on the respective predetermined areas of the second polycrystalline silicon layer and the second insulating layer;

masking predetermined zones of the third polycrystalline silicon layer lying at least partially above the predetermined areas and removing the portion of the third polycrystalline silicon layer external to these predetermined zones;

removing the portions of the second polycrystalline silicon layer, the first insulating layer, the first polycrystalline silicon layer and the relatively thin layer of silicon dioxide external to the predetermined zones so as to obtain the structure of gate electrodes and dielectric of the memory cells and the structure of capacitor electrodes.

BRIEF DESCRIPTION OF THE DRAWINGS

The present invention is set out in further detail in the following detailed description of a specific method which embodies its principle and is given by way of nonlimiting example with reference to the accompanying drawings, in which.

DESCRIPTION OF THE PREFERRED EMBODIMENT

Figure 1:
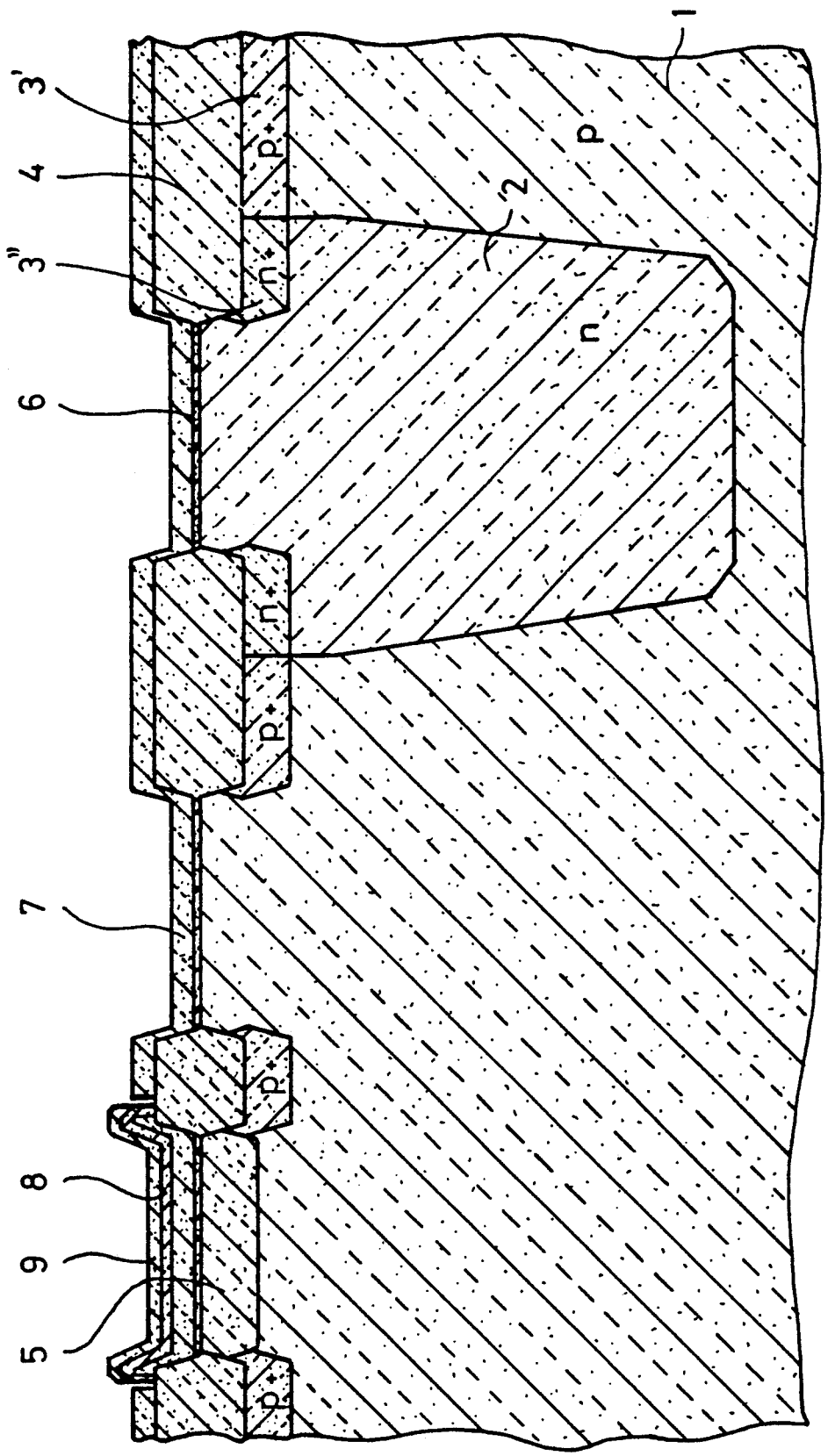
FIGS. 1 to 3 are partial sectional views of a silicon wafer during three separate stages of the method in accordance with the invention.

The method according to the embodiment of the invention initially comprises operations of a conventional type for the manufacture of integrated circuits with complementary MOS transistors (CMOS). It comprises the formation in a substrate 1 of semiconductor material of a first type of conductivity, for instance p-doped monocrystalline silicon, of pockets 2 of opposite conductivity, i.e. n-doped, by appropriate masking, doping and diffusion operations. These pockets are designed to contain p-channel transistors.

A layer of inert material, typically silicon nitride, is then deposited and is masked and shaped to form the active areas, i.e. those areas designed to contain transistors and memory cells.

By means of two successive masking stages, n-type and p-type doping ions are then implanted to increase the concentration of predetermined zones at the edges of the active areas for the formation of isolating or "channel stopper" regions.

A high temperature (900°-1000° C.) operation is then carried out in an oxidizing atmosphere in order to grow the so-called field oxide, i.e. comparatively thick portions of silicon dioxide, shown by 4 in the drawings, only in the zones not covered by the silicon nitride and all the doping species contained in the structure are caused to diffuse so as to obtain p-type isolating regions 3', shown by p+, in the substrate p and n-type regions 3", shown by n+, in the pockets n (only one of which is shown in the drawings).

After the removal of the nitride layer, appropriate masking and implantation operations are carried out to increase the concentration of p-type doping agents in the active zones designed to contain EPROM memory cells, shown by 5 in the drawings. Oxidation is then carried out to grow a thin layer (for instance 150-500 A) of silicon dioxide on the active zones for the subsequent formation of the gate dielectric of the transistors and memory cells. A polycrystalline silicon layer 7 is then deposited and doped and masking and etching operations are carried out to open up parallel slots in this layer in order to isolate the zones in which the memory cells are to be formed.

At this point, an insulating layer 8, for instance of silicon dioxide, is formed by oxidation at high temperature and a thin layer (for instance 500 A) of polycrystalline silicon 9 is deposited thereon.

Successive masking and chemical etching operations are then carried out to remove the polycrystalline silicon layer 9 and the underlying insulating layer 8 from the whole surface of the wafer with the exception of the zones destined for the memory cells.

According to an advantageous embodiment of the invention, the wafer is then subject to ion implantation with n-type impurities so as to increase the doping of the fist layer 7 of polycrystalline silicon to increase its electrical conductivity and therefore make it suitable to form one of the electrodes of the capacitors.

An insulating layer 10, for instance silicon dioxide obtained by vapor phase deposition by oxidation of tetraethylorthosilicate (TEOS) at approximately 700° C., is then formed and is removed by a masking and chemical etching operation from the whole of the wafer with the exception of predetermined areas above the field oxide. It can be seen that the thin layer 9 of polycrystalline silicon is designed to shield the memory cell zones during the method stages specifically for the formation of the capacitors.

Figure 2:
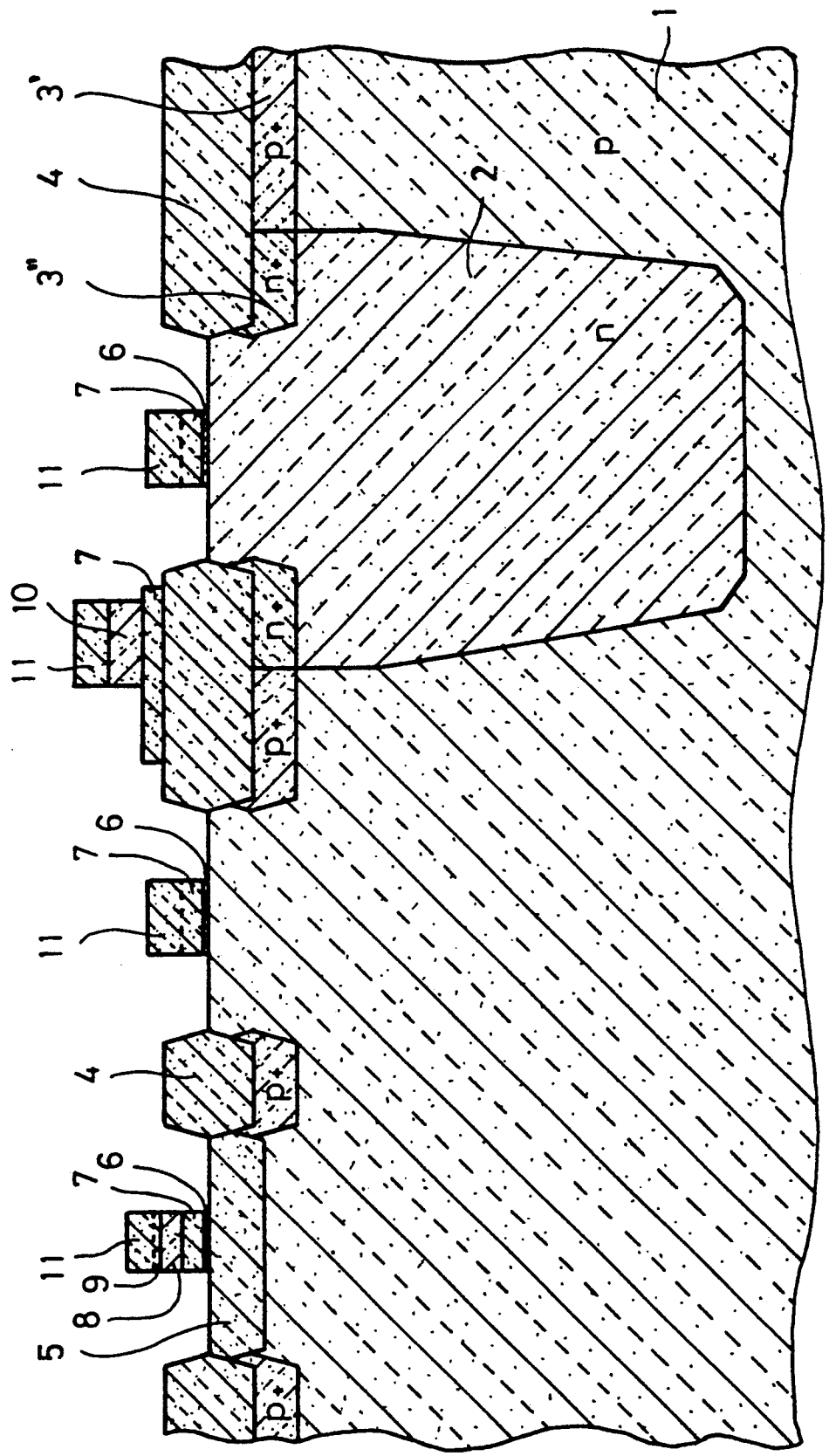

The method continues with the deposition of a layer 11 of polycrystalline silicon and masking and chemical etching operations, until the structure shown in FIG. 2 is achieved. As can be seen, in the active areas intended for the memory cells, there are superimposed portions of the layer of silicon dioxide 6 (gate dielectric), the first polycrystalline silicon layer 7 (floating gate electrode), the insulating layer 8 ("interpoly" dielectric) and the layers 9 and 11 of polycrystalline silicon (gate electrode) which are shown separated by dashed lines but cannot in practice be distinguished from one another as they are formed from the same material. In the active areas destined for the n-channel and p-channel transistors there are superimposed portions of the silicon dioxide layer 6 (gate dielectric), the first polycrystalline silicon layer 7 and the final polycrystalline silicon layer 11, the last two of which are shown separated by dashed lines but cannot in practice be distinguished from one another and together form the gate electrode of the transistors. In predetermined areas of the field oxide (only one of which is shown in the drawings) there are superimposed portions of the fist polycrystalline silicon layer 7 (first electrode of the capacitor), the silicon dioxide layer 10 (capacitor dielectric) and the final layer of polycrystalline silicon 11 (second electrode of the capacitor). A capacitor structure of this type is disclosed for instance in Italian Patent Application 23200 A/87 filed on 23 December 1987.

Figure 3:
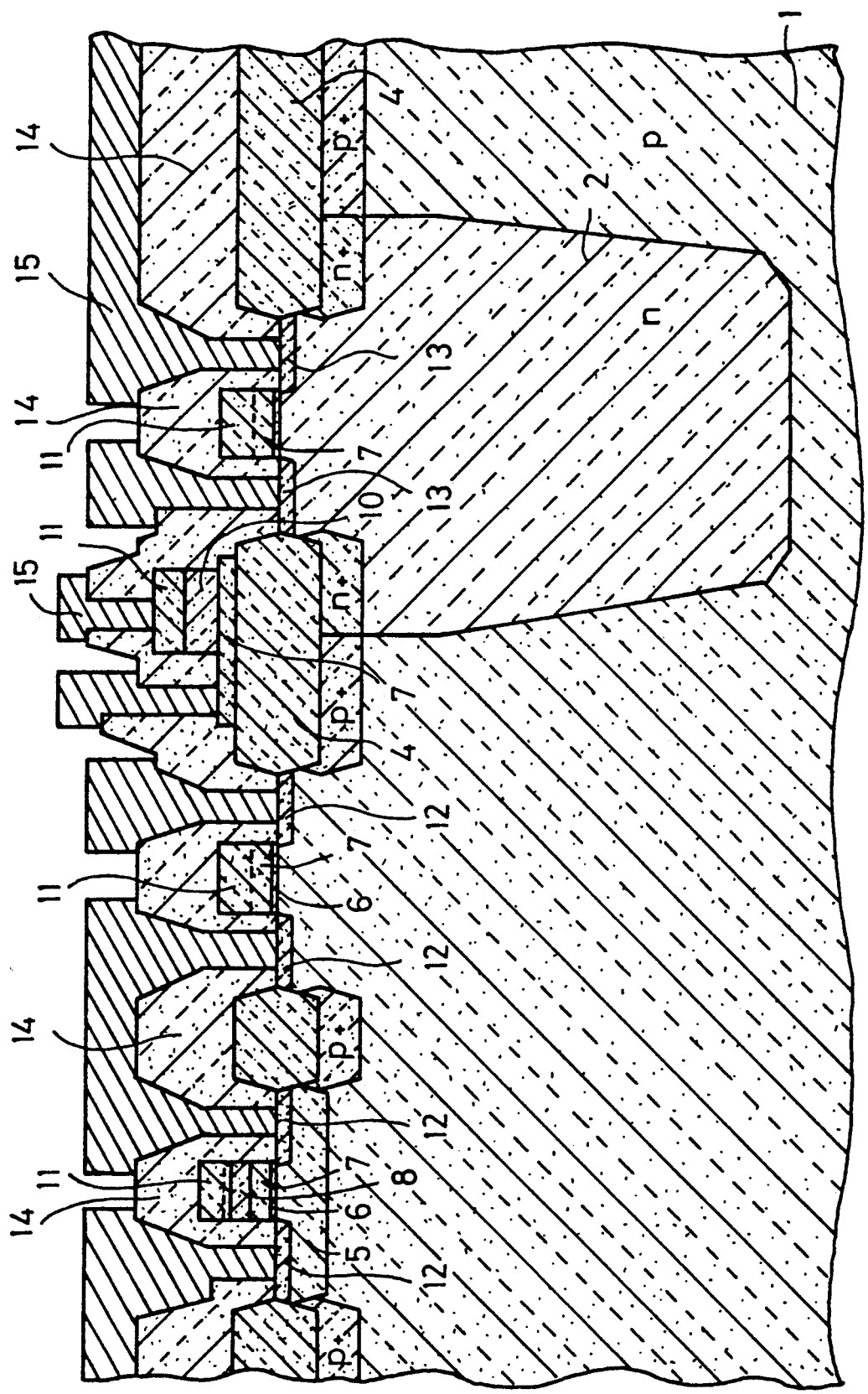

This is followed by subsequent conventional method steps comprising two successive masking operations for the implantation of ions of impurities of opposite type, followed by a high temperature treatment through which diffused source and drain regions are obtained in the active areas and, more particularly, n-type regions in the areas destined for the memory cells and the n-channel transistors, shown by 12 in FIG. 3, and p-type regions in the pockets 2, shown by 13 in FIG. 3, i.e. in the areas destined for the p-channel transistors.

An insulating layer is then formed, windows are opened for the contacts through this layer, a metal layer is deposited and is shaped by a masking operation to obtain the connections between the various components of the circuit. The structure shown in FIG. 3 is thus obtained, in which the remaining portions 14 of the insulating layer and the remaining portions 15 of the metal layer for the connections can be seen.

Finally, the whole assembly is covered with an insulating protective layer (not shown) in which, by masking and chemical etching, windows are opened for the connection wire contacts externally to the integrated circuit.

It can be seen from the above that the electrodes of the capacitors are formed using the same operations as needed for the formation of the gate electrodes of the memory cells. However, the capacitors can be designed with optimum characteristics, since the doping of the polycrystalline silicon which forms the lower electrode can be determined independently of that of the polycrystalline silicon which forms the floating gate of the memory cells and the dielectric layer of the capacitors may have a thickness and physical characteristics differing from those of the "interpoly" dielectric of the memory cells since it is formed independently of the latter.

Advantageously, this dielectric may be formed by deposition at low temperature with the result that there is no detrimental effect on the doping profiles previously formed.

This method consequently makes it possible to design and form the capacitors with extremely small dimensions and with considerable precision.

Moreover, since this method does not require a third thick layer of polycrystalline silicon for the formation of the electrodes of the capacitors, the planar nature of the final surface is in practice equivalent to that which is obtained with conventional methods using two levels of polycrystalline silicon.

Although a single embodiment of the invention has been described and illustrated, it is evident that many variants are possible without departing from the scope of the invention. For instance, the insulating layer which forms the "interpoly" dielectric may be formed by superimposed layers of silicon dioxide, obtained by high temperature oxidation of the underlying polycrystalline silicon layer 7, deposited silicon nitride and silicon dioxide obtained by oxidation of the underlying nitride. Similarly, the dielectric 10 of the capacitors may be formed by superimposed layers of different materials, rather than by a single layer of silicon dioxide. Moreover, the invention may be advantageously used both in CMOS technology methods and in NMOS or PMOS technology methods and in general in all cases in which it is desired to obtain electronic components comprising two electrodes separated by different dielectrics.

We claim:

1. A method of manufacturing integrated circuits on a substrate of a semiconductor material, the integrated circuits comprising electronic components of two different types each having pairs of electrodes separated by dielectric materials, the method comprising the steps of:

selectively forming dielectric materials of at least two different types on the substrate;

forming and doping a first polycrystalline silicon layer;

defining, by masking and removal, of predetermined zones of the first polycrystalline silicon layer on areas of the substrate previously covered with the dielectric materials;

forming a first insulating layer comprising at least one dielectric material, on the first polycrystalline silicon layer;

forming a second polycrystalline silicon layer on the first insulating layer;

masking at least one predetermined area of the second polycrystalline silicon layer, and removing the portion of the second polycrystalline silicon layer external to this predetermined area and removing the underlying portion of the first insulating layer;

forming a second insulating layer comprising at least one dielectric material, on the first polycrystalline silicon layer;

masking at least one other predetermined area of the second insulating layer and removing the portion of the second insulating layer external to this other predetermined area;

forming a third polycrystalline silicon layer at least on the respective predetermined areas of the second polycrystalline silicon layer and the second insulating layer;

masking predetermined zones of the third polycrystalline silicon layer lying at least partially above the predetermined areas and removing the portion of the third polycrystalline silicon layer external to these predetermined zones.

2. A method as recited in claim 1, wherein the first polycrystalline silicon layer is subjected to a doping step prior to the step of forming the second insulating layer thereon in order to increase its conductivity.

3. A method of manufacturing integrated circuits on a silicon substrate, the integrated circuits comprising capacitors and at least one of EPROM and EEPROM memory cells, the method comprising the steps of:

forming, by growth at a high temperature on the silicon substrate, relatively thick portions of silicon dioxide which define active zones for containing the memory cells;

forming, by growth, on the active zones, of a relatively thin layer of silicon dioxide;

forming and doping a first polycrystalline silicon layer on the relatively thick portions and on the relatively thin layer of silicon dioxide;

defining, by masking and removal, of predetermined zones of the first polycrystalline silicon layer;

forming a first insulating layer, comprising at least one dielectric material, on the first polycrystalline silicon layer;

forming a second polycrystalline silicon layer on the first insulating layer;

masking at least one predetermined area of the second polycrystalline silicon layer lying above an active zone, and removing the portion of the second polycrystalline silicon layer external to this predetermined area and removing the underlying portion of the first insulating layer;

doping the exposed portion of the first polycrystalline silicon layer;

forming a second insulating layer, comprising at least one dielectric material, on the first polycrystalline silicon layer;

masking at least one other predetermined area of the second insulating layer lying above at least one of the relatively thick portions of silicon dioxide and removing the portion of the second insulating layer external to this other predetermined area to define the dielectric of a capacitor;

forming a third polycrystalline silicon layer at least on the respective predetermined areas of the second polycrystalline silicon layer and the second insulating layer;

masking predetermined zones of the third polycrystalline silicon layer lying at least partially above the predetermined areas and removing the portion of the third polycrystalline silicon layer external to these predetermined zones;

removing the portions of the second polycrystalline silicon layer, the first insulating layer, the first polycrystalline silicon layer and the relatively thin layer of silicon dioxide external to the predetermined zones so as to obtain the structure of gate electrodes and dielectrics of the memory cells and the structure of capacitor electrodes.

4. A method as recited in claim 1, wherein the first insulating layer is formed by the following steps:

oxidizing the underlying first polycrystalline silicon layer;

depositing a layer of silicon nitride on the oxidized first polycrystalline silicon layer;

forming a layer of silicon dioxide on the silicon nitride layer.

5. A method as recited in claim 2, wherein the first insulating layer is formed by the following steps:

oxidizing the underlying first polycrystalline silicon layer;

depositing a layer of silicon nitride on the oxidized first polycrystalline silicon layer;

forming a layer of silicon dioxide on the silicon nitride layer.

6. A method as recited in claim 3, wherein the first insulating layer is formed by the following steps:

oxidizing the underlying first polycrystalline silicon layer;

depositing a layer of silicon nitride on the oxidized first polycrystalline silicon layer;

forming a layer of silicon dioxide on the silicon nitride layer.

7. A method as recited in claim 1, wherein the second insulating layer is formed by oxidizing tetraethylorthosilicate at a temperature of between 650° C. and 750° C.

8. A method as recited in claim 2, wherein the second insulating layer is formed by oxidizing tetraethylorthosilicate at a temperature of between 650° C. and 750° C.

9. A method as recited in claim 3, wherein the second insulating layer is formed by oxidizing tetraethylorthosilicate at a temperature of between 650° C. and 750° C.

10. A method as recited in claim 4, wherein the second insulating layer is formed by oxidizing tetraethylorthosilicate at a temperature of between 650° C. and 750° C.

11. A method as recited in claim 5, wherein the second insulating layer is formed by oxidizing tetraethylorthosilicate at a temperature of between 650° C. and 750° C.

12. A method as recited in claim 6, wherein the second insulating layer is formed by oxidizing tetraethylorthosilicate at a temperature of between 650° C. and 750° C.

* * * * *